(12) United States Patent
Hou

(10) Patent No.: US 11,374,156 B2
(45) Date of Patent: Jun. 28, 2022

(54) BACKLIGHT MODULE AND MANUFACTURING METHOD OF SAME

(71) Applicant: TCL CHINA STAR OPTOELECTRONICS TECHNOLOGY CO., LTD., Shenzhen (CN)

(72) Inventor: Weikang Hou, Shenzhen (CN)

( * ) Notice: Subject to any disclaimer, the term of this patent is extended or adjusted under 35 U.S.C. 154(b) by 153 days.

(21) Appl. No.: 16/640,360

(22) PCT Filed: Nov. 25, 2019

(86) PCT No.: PCT/CN2019/120567
§ 371 (c)(1),
(2) Date: Feb. 20, 2020

(87) PCT Pub. No.: WO2021/093014
PCT Pub. Date: May 20, 2021

(65) Prior Publication Data
US 2021/0343919 A1    Nov. 4, 2021

(30) Foreign Application Priority Data
Nov. 15, 2019   (CN) .......................... 201911116697.8

(51) Int. Cl.
*H01L 33/64* (2010.01)
*F21V 29/54* (2015.01)
*F21V 33/00* (2006.01)

(52) U.S. Cl.
CPC .......... *H01L 33/641* (2013.01); *F21V 29/54* (2015.01); *F21V 33/0052* (2013.01); *H01L 2933/0075* (2013.01)

(58) Field of Classification Search
CPC . G02F 1/133602–133613; F21V 29/54; H01L 33/64–648
See application file for complete search history.

(56) References Cited

U.S. PATENT DOCUMENTS

| 10,050,091 B2 * | 8/2018 | Lee .......................... H01L 35/32 |
| 2009/0231851 A1 * | 9/2009 | Lai .......................... F21V 29/74 362/253 |
| 2013/0003355 A1 * | 1/2013 | Moriya ............. G02F 1/133603 362/97.3 |
| 2016/0329478 A1 * | 11/2016 | Jin .......................... G09G 5/00 |

FOREIGN PATENT DOCUMENTS

| CN | 101413736 A | 4/2009 |
| CN | 101532657 A | 9/2009 |
| CN | 202158432 U | 3/2012 |
| CN | 202546687 U | 11/2012 |
| CN | 103527955 A | 1/2014 |
| CN | 104882074 A * | 9/2015 |

(Continued)

*Primary Examiner* — Mariceli Santiago

(57) ABSTRACT

A backlight module and a manufacturing method of same are provided by this disclosure. The backlight module includes a frame, a thermoelectric device group, a first heat conductive layer and a lamp plate. The thermoelectric device group is disposed on a bottom surface inside the frame. The first heat conductive layer is disposed on a surface at a side of the thermoelectric device group away from the frame. The lamp plate is disposed on a surface at a side of the first heat conductive layer away from the frame.

8 Claims, 7 Drawing Sheets

(56) References Cited

FOREIGN PATENT DOCUMENTS

| CN | 105515446 A | | 4/2016 | |
|---|---|---|---|---|
| CN | 108693671 A | | 10/2018 | |
| CN | 208721955 U | * | 4/2019 | |
| CN | 209375219 U | * | 9/2019 | |
| JP | 2009099406 A | * | 5/2009 | |
| JP | 2010192174 A | * | 9/2010 | |
| JP | 2011154923 A | * | 8/2011 | |
| KR | 100928728 B1 | * | 11/2009 | |
| KR | 20100048320 A | * | 5/2010 | |
| KR | 20120092772 A | | 8/2012 | |
| KR | 20170005245 A | * | 1/2017 | ............. H01L 35/32 |

\* cited by examiner

BACKLIGHT MODULE AND MANUFACTURING METHOD OF SAME

CROSS-REFERENCE

This application claims priority to Chinese Application No. 201911116697.8, filed on 2019 Nov. 15, and titled "Backlight Module and Manufacturing Method of Same". The entire disclosure of the above application is incorporated herein by reference.

BACKGROUND OF INVENTION

Field of Invention

This disclosure relates to the display field, and particularly, relates to a backlight module and a manufacturing method of same.

Description of Prior Art

Liquid crystal display devices are widely used. Moreover, a backlight module is an important component of the liquid crystal displays, which can directly affect the color performance of display devices. Generally, LED lamps are chosen as backlights of a backlight module. As to a direct-type structural backlight module, the LED lamps generate a lot of heat during long-time operation, and high temperature can seriously affect performance and lifetime of the LEDs. Light emission efficiency of white light LEDs decreases under high temperature, and even causes color deviation. As to QLED display panels, quenching of quantum dots occurs at high temperature. Additionally, high temperature of the backlight module will affect the deflection of liquid crystals, thus inducing abnormality or light leakage. Now, for common heat dissipation devices, heat is dissipated through the heat dissipation metal plate. LED lamp strips/lamp plates directly contact the heat dissipation metal plate. The heat dissipation metal plate is fixedly connected to a backplate. Heat and power generated by the LED lamp strips/lamp plates are transmitted to the heat dissipation metal plates, and then dissipated through the contact surface between the heat dissipation metal plates and the backplate. However, the heat dissipation mode between the LED light panel, the heat dissipation metal panel, and the backplate is passive heat dissipation in the prior art. Additionally, there exist air gaps, which results in low heat conductive efficiency between all layers and inefficient dissipation of the heat generated, which easily leads to heat accumulation.

This disclosure aims at providing a backlight module and a manufacturing method of the same to solve the technical problems of low heat dissipation efficiency and a difficulty in retrieving dissipated heat in the prior art.

SUMMARY OF INVENTION

To fulfill the above purpose, a backlight module is provided by this disclosure, comprising a frame, a thermoelectric device group, a first heat conductive layer and a lamp plate. The thermoelectric device group is disposed on a bottom surface inside the frame. The first heat conductive layer is disposed on a surface at a side of the thermoelectric device group away from the frame. The lamp plate is disposed on a surface at a side of the first heat conductive layer away from the frame.

Furthermore, the backlight module further comprises a phase change heat storage layer and an energy storage device. The phase change heat storage layer is disposed on the bottom surface inside the frame, wherein a side surface is connected to an inner sidewall of the frame. One end of the energy storage device is electrically connected to the thermoelectric device group and another end is electrically connected to a driver circuit.

Furthermore, the backlight module further comprises a second heat conductive layer disposed on the bottom surface inside the frame and connected to an edge on a side of the thermoelectric device group.

Furthermore, the backlight module further comprises a phase change heat storage layer and an energy storage device. The phase change heat storage layer is disposed on the bottom surface inside the frame, wherein a side surface is connected to an inner sidewall of the frame, and another side surface is connected to the second heat conductive layer. One end of the energy storage device is electrically connected to the thermoelectric device group and another end is electrically connected to a driver circuit.

Furthermore, a height of the second heat conductive layer is less than or equal to a height of the phase change heat storage layer.

Furthermore, a material of the phase change heat storage layer comprises at least one of crystalline hydrate salt, molten salt, metal or alloy, paraffin, or fatty acid; and/or the first heat conductive layer is at least one of heat conductive silicone grease, alumina heat conductive rubber, or boron nitride conductive rubber; and/or the second heat conductive layer is at least one of heat conductive silicone grease, alumina heat conductive rubber, or boron nitride heat conductive rubber.

To fulfill the above purpose, a manufacturing method of a backlight module is provided by this disclosure, comprising steps of: a thermoelectric device group mounting step of mounting two groups of thermoelectric devices to a bottom surface inside a frame to form a thermoelectric device group; a first heat conductive layer forming step of coating a thermoelectric conductive material on an upper surface of the thermoelectric device group to form a first heat conductive layer; and a lamp plate mounting step of mounting a lamp plate above the thermoelectric device group, wherein a lower surface of the lamp plate is connected to the first heat conductive layer.

Furthermore, the manufacturing method of the backlight module further comprises below steps following the lamp plate mounting step of: a phase change heat storage layer forming step of forming a phase change heat storage layer on the bottom surface inside the frame, wherein a side surface of the phase change heat storage layer is connected to an inner sidewall of the frame; and an energy storage device mounting step of mounting an energy storage device in the frame, wherein one end of the energy storage device is electrically connected to the thermoelectric device group and another end is electrically connected to a driver circuit.

Furthermore, the manufacturing method of the backlight module further comprises a below step following the lamp plate mounting step of: a second heat conductive layer forming step of coating the thermoelectric conductive material on the bottom surface inside the frame to form a second heat conductive layer.

Furthermore, the manufacturing method of the backlight module further comprises below steps following the second heat conductive layer forming step of: a phase change heat storage layer forming step of forming a phase change heat storage layer on the bottom surface inside the frame, wherein a side surface of the phase change heat storage layer is connected to an inner sidewall of the frame, and another side surface is connected to the second heat conductive layer; and an energy storage device mounting step of mounting an energy storage device in the frame, wherein one end of the energy storage device is electrically connected to the thermoelectric device group and another end is electrically connected to a driver circuit.

Advantageous effects of this disclosure are to provide a backlight module and a manufacturing method of the same. By disposing a heat conductive layer at a joint of the thermoelectric device group and the LED lamp plate, heat dissipation efficiency is further increased, and a heat dissipation effect is improved. Furthermore, the heat conductive layer and the phase change heat storage layer are disposed between the frame and the thermoelectric device group inside the frame in this disclosure. Heat of the thermoelectric device group is transmitted to the phase change heat storage layer so that the recycle of heat from the lamp plate is accomplished.

BRIEF DESCRIPTION OF DRAWINGS

In order to more clearly illustrate the technical solution of this disclosure, a brief description of the drawings that are necessary for the illustration of the embodiments will be given as follows. Obviously, the drawings described below show only some embodiments of this disclosure, and a person having ordinary skill in the art may also obtain other drawings based on the drawings described without making any creative effort.

Reference numbers of components in the attached drawings are as below:

1 frame; 2 thermoelectric device group;
3 first heat conductive layer; 4 lamp plate;
5 second heat conductive layer; 6 phase change heat storage layer; 7 energy storage device;
20 thermoelectric device; 21 substrate; 22 thermoelectric film layer;
201 thermoelectric arm; 202 electrode;
2011 first thermoelectric arm; 2012 second thermoelectric arm;
41 plate body; 42 LED lamp.

DETAILED DESCRIPTION OF PREFERRED EMBODIMENTS

Hereinafter, the preferred embodiments of this disclosure are introduced with reference to the drawings of the specification to prove that the disclosure can be implemented. These embodiments can completely introduce the technical content of the disclosure to those skilled in the art, so as to make the technical content of the disclosure clearer and easier to understand. However, the disclosure can be embodied by many different forms of embodiments, and the protection scope of the disclosure is not limited to the embodiments mentioned herein.

The First Embodiment

Figure 1:
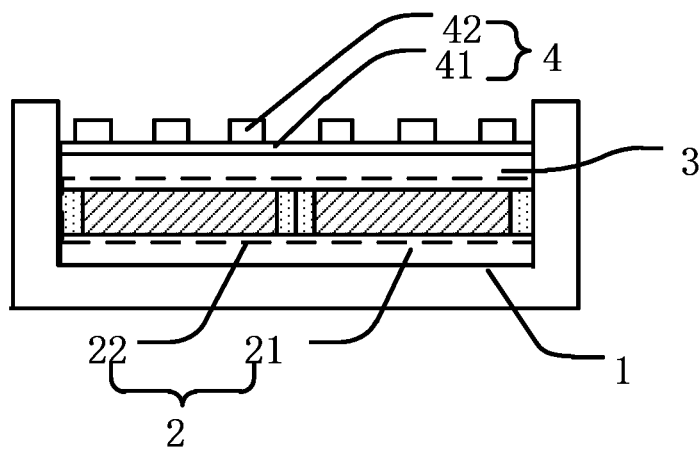
FIG. 1 is a cross-sectional view of a backlight module according to the first embodiment.
Figure 2:
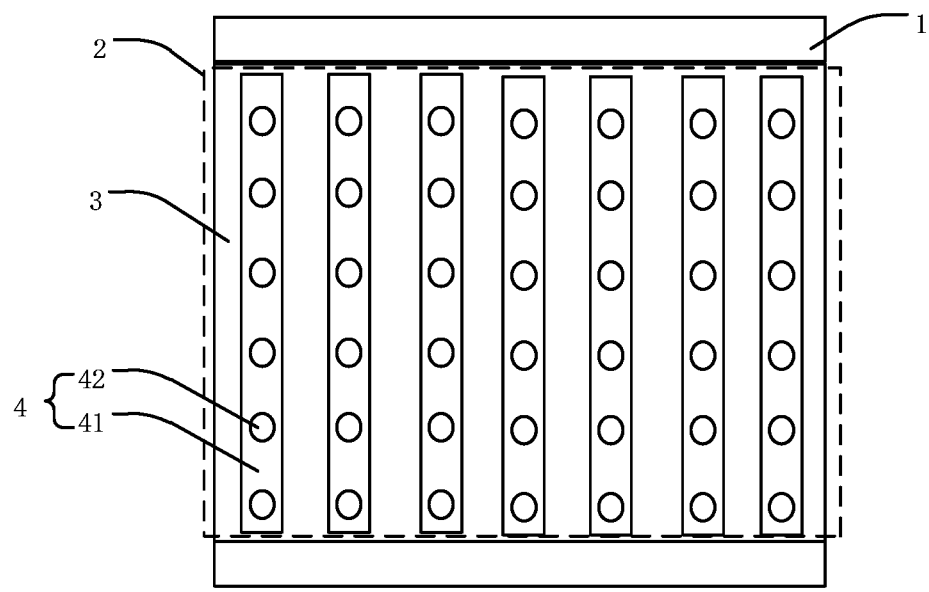
FIG. 2 is a plan view of the backlight module according to the first embodiment.

As shown in FIG. 1 to FIG. 2, a backlight module is provided by this embodiment. The backlight module is a direct-type backlight module comprising a frame 1, a thermoelectric device group 2, a first heat conductive layer 3, and a lamp plate 4.

A material of the frame 1 is an aluminum plate which acts as a supporting component.

The thermoelectric device group 2 is disposed on a bottom surface inside the frame 1. The thermoelectric device group 2 comprises a flexible substrate 21 and a thermoelectric film layer 22. Specifically, the flexible substrate 21 is disposed on the bottom surface inside the frame 1. The flexible substrate 21 is preferred to be a polyimide (PI) substrate. The thermoelectric film layer 22 is attached to an upper surface of the flexible substrate 21. A thickness of the thermoelectric film layer 22 is 0.25 mm-5 mm.

Figure 3:
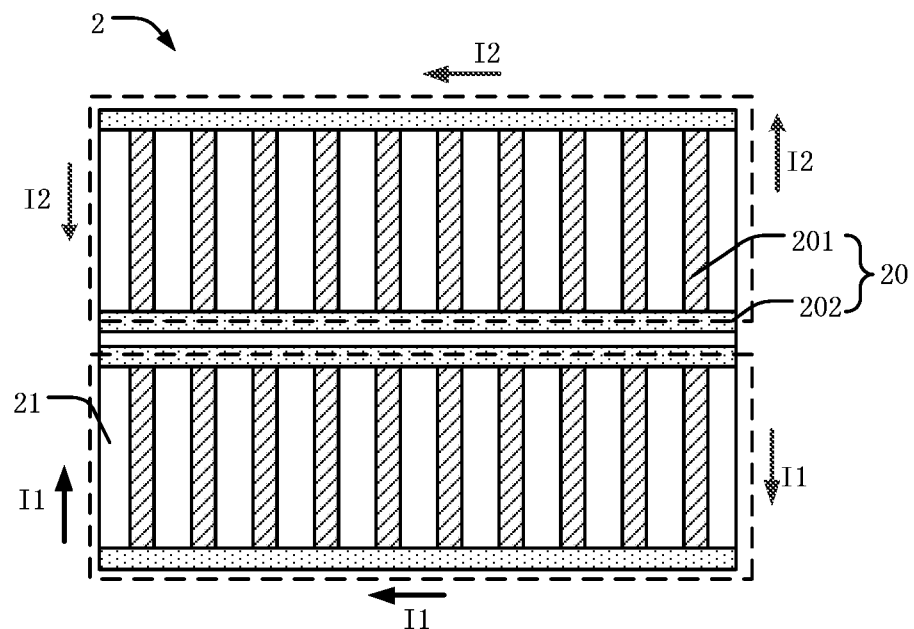
FIG. 3 is a schematic diagram of working principle of a thermoelectric device group according to the first embodiment.

As shown in FIG. 3, the thermoelectric device group 2 comprises at least two groups of thermoelectric devices 20 disposed opposite to each other. The thermoelectric devices 20 are defined as thermoelectric film devices. Compared to thermoelectric block devices, the thermoelectric film devices have a smaller volume, a more flexible structure, and space-saving characteristics. Current directions of the two groups of thermoelectric devices 20 are opposite. A direction of current I1 of the first group of thermoelectric devices 20 is clockwise, while a direction of current I2 of the other group of thermoelectric devices 20 is counterclockwise. A hot end of each of the thermoelectric devices 20 is disposed on an edge of the frame 1, and a cold end is disposed in a center of the frame 1. It should be noted that the thermoelectric film layer 22 in this embodiment is defined as the two groups of thermoelectric devices 20 disposed opposite to each other.

Each of the thermoelectric devices 20 comprises two thermoelectric arms 201 and an electrode 202. The thermoelectric arms 201 are bar-shaped. Each of the thermoelectric arms 201 is connected to the other thermoelectric arm 201 in parallel through the electrode 202. The thermoelectric arms 201 can be divided into p-type thermoelectric arms and n-type thermoelectric arms. The number of the thermoelectric arms can be determined according to a size of the frame.

Figure 4:
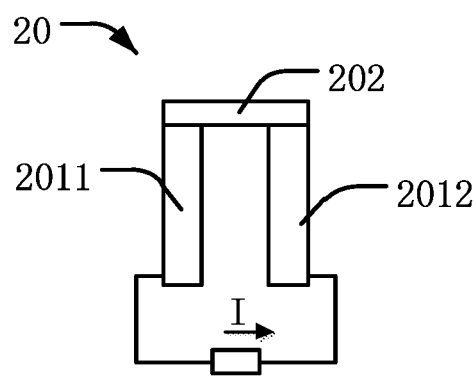
FIG. 4 is a schematic diagram of working principle of the thermoelectric device according to the first embodiment.

As shown in FIG. 4, the thermoelectric devices 20 comprises a first thermoelectric arm 2011, a second thermoelectric arm 2012, and an electrode 202. The first thermoelectric arm 2011 is a p-type thermoelectric arm, and the second thermoelectric arm 2012 is an n-type thermoelectric arm. The first thermoelectric arm 2011 and the second thermoelectric arm 2012 are electrically connected by the electrode 202. One end of the electrode 202 is connected to the first thermoelectric arm 2011, and the other end is connected to the second thermoelectric arm 2012.

The working principle of the thermoelectric device group 2 is as below: when there is a temperature difference between two ends of the thermoelectric device, due to the Seebeck effect (also called the first thermoelectric effect), carriers (electrons) in the n-type thermoelectric arm material and carriers (holes) in the p-type thermoelectric arm material in the device directionally transfer from a high temperature end to a low temperature end. A directional current is formed in the circuit, which is the most basic principle of thermoelectric electricity generation. When the current is applied to the thermoelectric device, due to the Peltier effect, carriers (electrons) in the n-type thermoelectric arm material and carriers (holes) in the p-type thermoelectric arm material will transfer from a next end to a previous end of the two thermoelectric arms respectively under the applied electric field, and heat of the next end of the thermoelectric arm will be carried at the same time and input to the previous end of the device. It is the most basic principle of thermoelectric refrigeration.

The thermoelectric device is a kind of functional devices which can accomplish a mutual conversion of electric energy between thermal energy. The thermoelectric device accomplishes thermoelectric electricity generation and electric refrigeration based on Seebeck effect and Peltier effect of materials, respectively. There is no complex mechanical transmission structure in the thermoelectric devices. A refrigerant required by traditional refrigeration devices is not needed. Moreover, response speed of the devices is quick, there is no noise when in operation, temperature control is accurate, the devices are friendly to environment, and lifetime of the devices is long.

Please refer to FIG. 1 to FIG. 2. The first heat conductive layer 3 is disposed on an upper surface of the thermoelectric device group 2. A material of the first heat conductive layer 3 is at least one of heat conductive silicone grease, alumina heat conductive rubber, or boron nitride heat conductive rubber. The material is used for heat conducting and has high heat dissipation efficiency.

The lamp plate 4 is disposed on an upper surface of the first heat conductive layer 3. The lamp plate 4 comprises a plurality of plate bodies 41 and a plurality of LED lamps 42. The LED lamps 42 are disposed on an upper surface of the LED lamps 42 and electrically connected to the thermoelectric devices 20.

A backlight module is provided by this disclosure. By disposing a first heat conductive layer at a joint of the thermoelectric device group and the LED lamp plate, heat dissipation efficiency is further increased, and a heat dissipation effect is improved.

Figure 5:
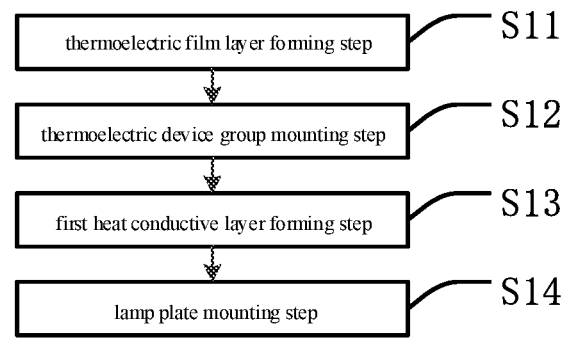
FIG. 5 is a flow chart of a manufacturing method of the backlight module according to the first embodiment.

As shown in FIG. 5, a manufacturing method of a backlight module is provided by this embodiment, comprising step11 to step14:

S11: a thermoelectric film layer forming step of forming a thermoelectric film layer on a flexible substrate with thermoelectric material by means of vacuum evaporation, magnetron sputtering, or screen printing, wherein the thermoelectric film layer is encapsulated and assembled to form the thermoelectric device group;

S12: as shown in FIG. 1, a thermoelectric device group mounting step of mounting two groups of thermoelectric devices 20 to a bottom surface inside a frame 1 to form a thermoelectric device group 2;

S13: a first heat conductive layer forming step of coating a thermoelectric conductive material on an upper surface of the thermoelectric device group to form a first heat conductive layer; wherein a material of the heat conductive layer is at least one of heat conductive silicone grease, alumina heat conductive rubber, or boron nitride heat conductive rubber;

S14: as shown in FIG. 1, a lamp plate mounting step of mounting a lamp plate 4 above the thermoelectric device group 2, wherein a lower surface of the lamp plate 4 is connected to the first heat conductive layer 3; wherein the first heat conductive layer conduct heat of the lamp plate to the thermoelectric device group to accomplish high efficient heat dissipation of the lamp plate.

The manufacturing method of the backlight module is provided by this disclosure. By disposing a first heat conductive layer at a joint of the thermoelectric device group and the LED lamp plate, the heat dissipation efficiency is further increased, and the heat dissipation effect is improved.

The Second Embodiment

A backlight module and a manufacturing method of the same are provided by this embodiment, comprising most of technical features of the first embodiment. And a difference between this embodiment and the first embodiment is that the backlight module further comprises a second heat conductive layer.

Figure 6:
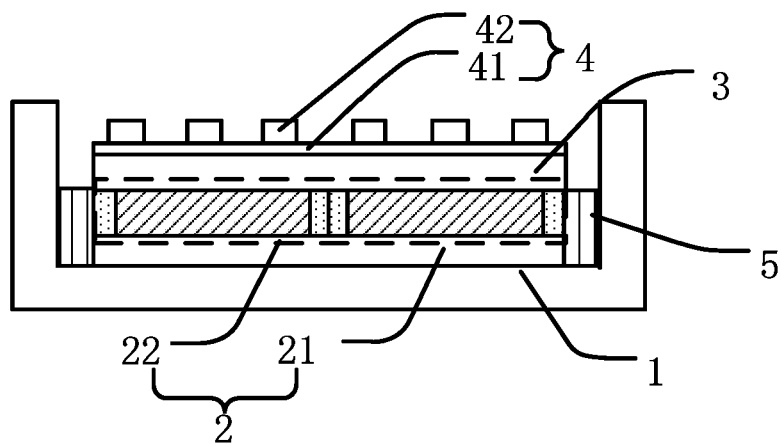
FIG. 6 is a cross-sectional view of a backlight module according to the second embodiment.
Figure 7:
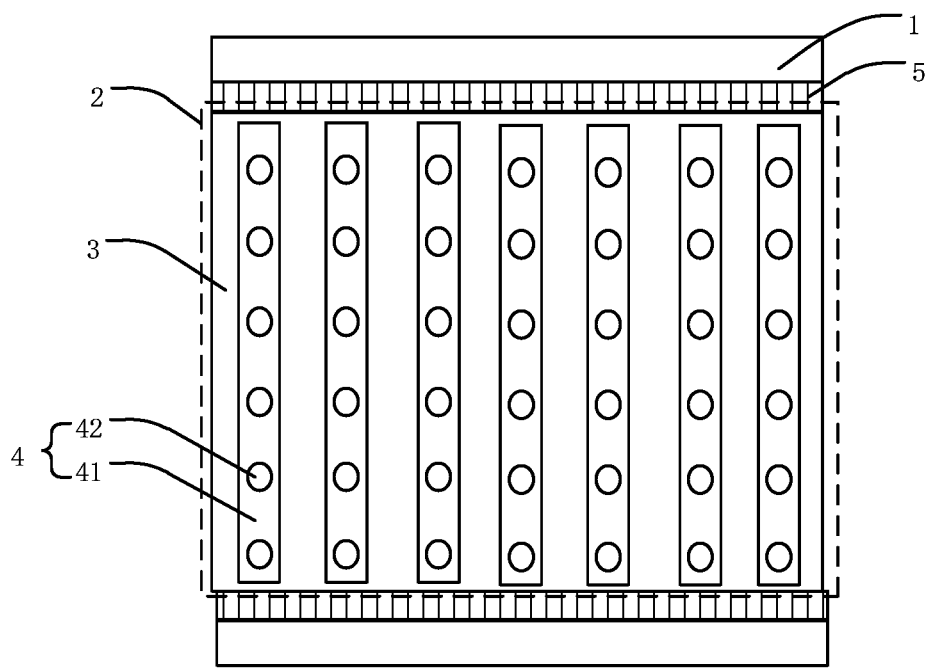
FIG. 7 is a plan view of the backlight module according to the second embodiment.

As shown in FIG. 6 to FIG. 7, a backlight module is provided by this embodiment, comprising a frame 1, a thermoelectric device group 2, a first heat conductive layer 3, a lamp plate 4, and a second heat conductive layer 5.

The second heat conductive layer 5 is disposed on the bottom surface inside the frame 1 and connected to an edge on a side of the thermoelectric device group 2. Specifically, a side surface of the second heat conductive layer 5 is connected to an inner sidewall of the frame 1 and another side surface is connected to the thermoelectric device group 2. A material of the second heat conductive layer 5 is at least one of heat conductive silicone grease, alumina heat conductive rubber, or boron nitride heat conductive rubber. The second heat conductive layer 5 can accelerate the heat dissipation of the lamp plate, further increase the heat dissipation efficiency, and improve the heat dissipation effect.

Figure 8:
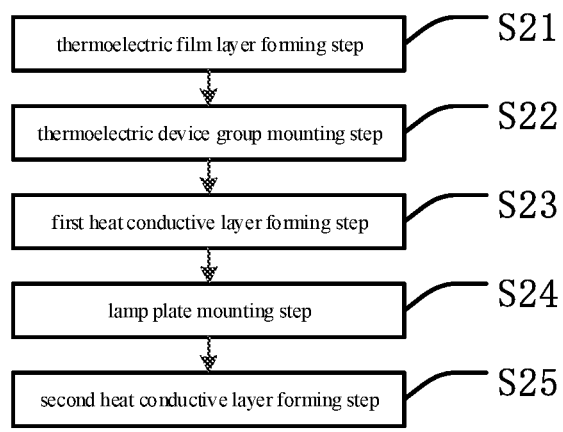
FIG. 8 is a flow chart of a manufacturing method of a backlight module according to the third embodiment.

As shown in FIG. 8, a manufacturing method of a backlight module is provided by this embodiment, comprising step21 to step25:

S21: a thermoelectric film layer forming step of forming a thermoelectric film layer on a flexible substrate with thermoelectric material by means of vacuum evaporation, magnetron sputtering, or screen printing, wherein the thermoelectric film layer is encapsulated and assembled to form the thermoelectric device group;

S22: as shown in FIG. 6, a thermoelectric device group mounting step of mounting two groups of thermoelectric devices 20 to a bottom surface inside a frame 1 to form a thermoelectric device group 2;

S23: a first heat conductive layer forming step of coating a thermoelectric conductive material on an upper surface of the thermoelectric device group to form a first heat conductive layer; wherein a material of the heat conductive layer is at least one of heat conductive silicone grease, alumina heat conductive rubber, or boron nitride heat conductive rubber;

S24: as shown in FIG. 6, a lamp plate mounting step of mounting a lamp plate 4 above the thermoelectric device group 2, wherein a lower surface of the lamp plate 4 is connected to the first heat conductive layer 3; wherein the first heat conductive layer conducts heat of the lamp plate to the thermoelectric device group to accomplish high efficient heat dissipation of the lamp plate.

S25: As shown in FIG. 6, a second heat conductive layer forming step of coating a thermoelectric conductive material on the bottom surface inside the frame 1 to form a second heat conductive layer 5, wherein a material of the heat conductive layer is at least one of heat conductive silicone grease, alumina heat conductive rubber, or boron nitride heat conductive rubber; The second heat conductive layer can accelerate the heat dissipation of the lamp plate, further increase the heat dissipation efficiency, and improve the heat dissipation effect.

The manufacturing method of the backlight module is provided by this disclosure. By disposing a first heat conductive layer at a joint of the thermoelectric device group and the LED lamp plate and disposing a second heat conductive layer between the thermoelectric device group and the inner sidewall of the frame, heat dissipation of the lamp plate is accelerated, the heat dissipation efficiency is further increased, and the heat dissipation effect is improved.

The Third Embodiment

A backlight module and a manufacturing method of the same are provided by this embodiment, comprising most of technical features of the first embodiment. And a difference between this embodiment and the first embodiment is that the backlight module further comprises a phase change heat storage layer and an energy storage device.

Figure 9:
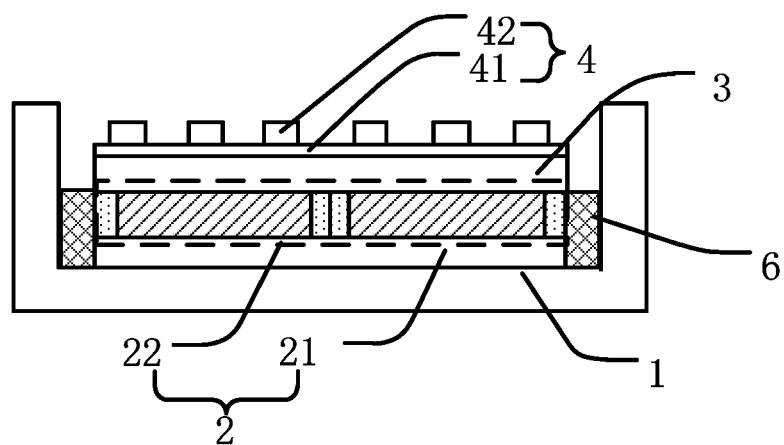
FIG. 9 is a cross-sectional view of the backlight module according to the third embodiment.
Figure 10:
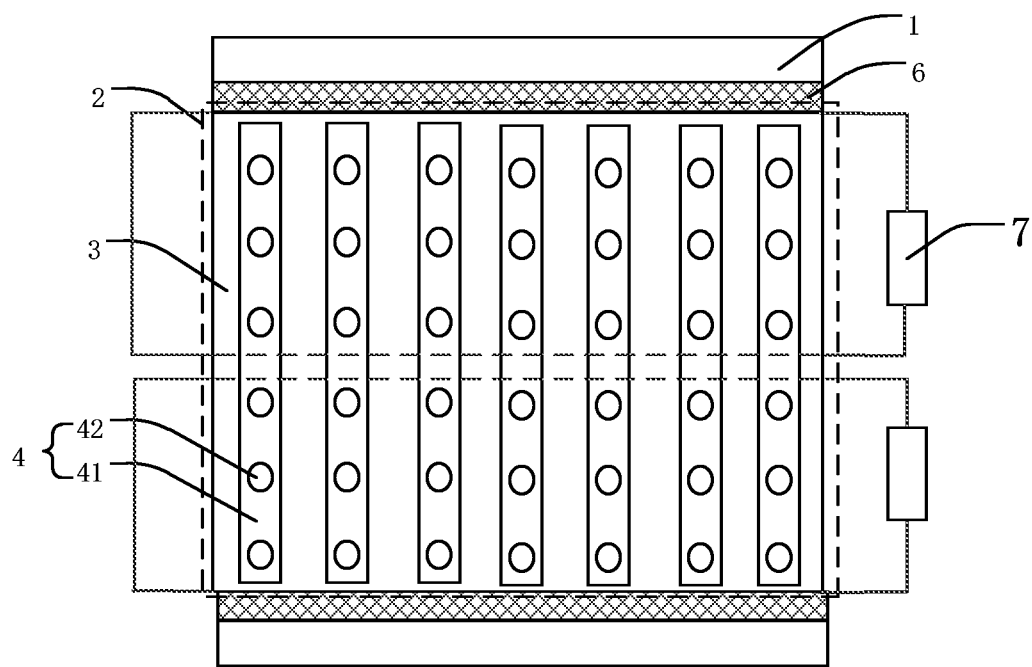
FIG. 10 is a plan view of the backlight module according to the third embodiment.

As shown in FIG. 9 to FIG. 10, a backlight module is provided by this embodiment. The backlight module is a direct-type backlight module comprising a frame 1, a thermoelectric device group 2, a first heat conductive layer 3, a lamp plate 4, a phase change heat storage layer 6, and an energy storage device 7.

As shown in FIG. 9 to FIG. 10, the phase change heat storage layer 6 is disposed on a bottom surface inside the frame, a side surface of the phase change heat storage layer 6 is connected to an inner sidewall of the frame 1, and another side surface is connected to the thermoelectric device group 2. A material of the phase change heat storage layer 6 comprises at least one of crystalline hydrate salt, molten salt, metal or alloy, paraffin, or fatty acid. Considering the low efficiency of heat storage induced by the thin thickness of the thermoelectric film layer 22, a thickness of the phase change heat storage layer 6 is increased to improve the heat storage.

One end of the energy storage device 7 is electrically connected to the thermoelectric device group 2, and another end is electrically connected to a driver circuit. The driver circuit is a TFT driver circuit.

While in operation, the LED lamps 42 transmit heat to the thermoelectric device group 2 more efficiently through the first heat conductive layer 3, and the thermoelectric device group 2 transmits heat from the center of the thermoelectric arms 201 to both ends. Herein, heat is concentrated at the frame 1 on both sides of the backlight module, so as to accomplish heat dissipation of the backlight module. The phase change heat storage layers 6 are disposed on both sides of the frame 1, and the heat concentrated at the frame 1 on both sides of the backlight module is recycled. Specifically, the thermoelectric device group 2 transmits heat to the phase change heat storage layer 6. After the material of the phase change heat storage layer 6 is heated, solid-solid phase change or solid-liquid phase change will occur to store the heat, and at the same time the heat of the hot end of the thermoelectric device group 2 is carried away, so that the thermoelectric device group 2 continuously transmits the heat of the LED lamps 42 to the phase change thermal storage layer 6. When the display device is turned off, the LED lamps 42 are extinguished, and the solid-solid phase change or liquid-solid phase change occurs in the phase change heat storage layer 6, thereby releasing heat. At this moment, temperature difference is generated between two ends of the thermoelectric device group 2. A current is generated by the thermoelectric device 20 due to Seebeck effect, and electric energy output by the thermoelectric device group 20 will be stored in the energy storage device 7. The energy storage device 7 is connected to a TFT driver circuit, which can be used for driving a circuit when the display device works. Compared to the prior art, the thermoelectric devices with excellent active heat dissipation performance and a function of converting heat to electric energy are adopted by the backlight module provided in this embodiment. By using the thermoelectric device group together with the phase change heat storage layer, precise temperature control and heat recycle of the LED light source in the backlight module are accomplished. Energy recycling is accomplished, energy consumption is reduced, and energy utilization rate is effectively improved.

Figure 11:
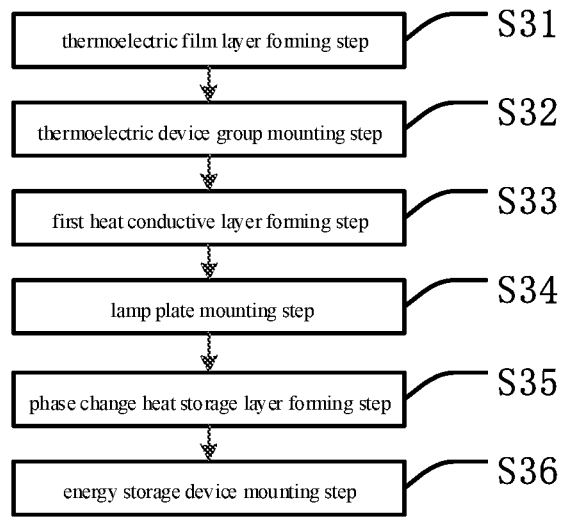
FIG. 11 is a flow chart of a manufacturing method of the backlight module according to the third embodiment.

As shown in FIG. 11, a manufacturing method of a backlight module is provided by this embodiment, comprising step31 to step36:

S31: a thermoelectric film layer forming step of forming a thermoelectric film layer on a flexible substrate with thermoelectric material by means of vacuum evaporation, magnetron sputtering, or screen printing, wherein the thermoelectric film layer is encapsulated and assembled to form the thermoelectric device group;

S32: as shown in FIG. 9, a thermoelectric device group mounting step of mounting two groups of thermoelectric devices 20 to a bottom surface inside a frame 1 to form a thermoelectric device group 2;

S33: a first heat conductive layer forming step of coating a thermoelectric conductive material on an upper surface of the thermoelectric device group to form a first heat conductive layer; wherein the heat conductive material is at least one of heat conductive silicone grease, alumina heat conductive rubber, or boron nitride heat conductive rubber, and the material is used for heat conducting and has high heat dissipation efficiency.

S34: as shown in FIG. 9, a lamp plate mounting step of mounting a lamp plate 4 above the thermoelectric device group 2, wherein a lower surface of the lamp plate 4 is connected to the first heat conductive layer 3;

S35: as shown in FIG. 9, a phase change heat storage layer forming step of forming a phase change heat storage layer 6 on the bottom surface inside the frame 1, wherein a side surface of the phase change heat storage layer 6 is connected to an inner sidewall of the frame 1, and another side surface is connected to the thermoelectric device group 2; and a material of the phase change heat storage layer 6 comprises at least one of crystalline hydrate salt, molten salt, metal or alloy, paraffin, or fatty acid. Considering the low efficiency of heat storage induced by the thin thickness of the thermoelectric film layer 22, a thickness of the phase change heat storage layer 6 is increased to improve the heat storage.

S36: as shown in FIG. 10, an energy storage device mounting step of mounting an energy storage device 7 in the frame 1, wherein one end of the energy storage device 7 is electrically connected to the thermoelectric device group 2, and another end is electrically connected to a driver circuit. On one hand, the energy storage device 7 can accomplish the heat recycle of the thermoelectric device group 2. On the other hand, it can provide a current for the driver circuit.

The backlight module and the manufacturing method of the backlight module are provided by this disclosure. By disposing a first heat conductive layer at a joint of the thermoelectric device group and the LED lamp plate, heat dissipation efficiency is further increased, and a heat dissipation effect is improved. Furthermore, the phase change heat storage layer is disposed between the frame and the thermoelectric device group inside the frame in this disclosure. Heat of the thermoelectric device group is transmitted to the phase change heat storage layer, so that the recycle of the heat from the lamp plate is fulfilled.

The Fourth Embodiment

A backlight module and a manufacturing method of the same are provided by this embodiment, comprising most of technical features of the third embodiment, and further comprising a second heat conductive layer.

Figure 12:
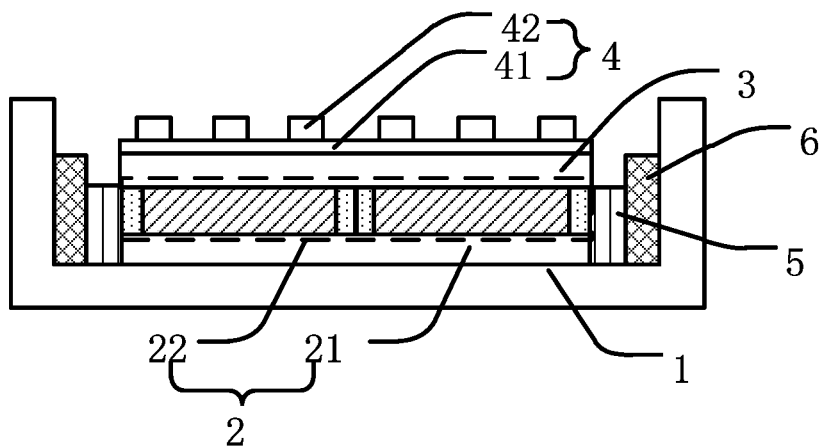
FIG. 12 is a cross-sectional view of a backlight module according to the fourth embodiment.
Figure 13:
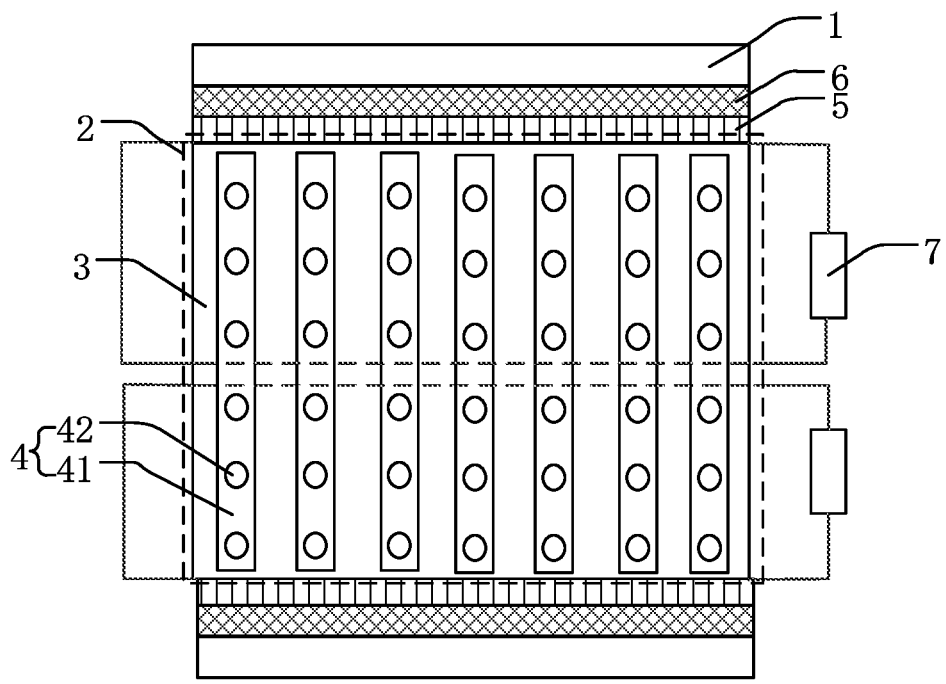
FIG. 13 is a plan view of the backlight module according to the fourth embodiment.

As shown in FIG. 12 to FIG. 13, a backlight module is provided by this embodiment. The backlight module is a direct-type backlight module comprising a frame 1, a thermoelectric device group 2, a first heat conductive layer 3, a lamp plate 4, a second heat conductive layer 5, a phase change heat storage layer 6, and an energy storage device 7.

The second heat conductive layer 5 is disposed on the bottom surface inside the frame 1 and connected to an edge on a side of the thermoelectric device group 2. A material of the second heat conductive layer 5 is at least one of heat conductive silicone grease, alumina heat conductive rubber, or boron nitride heat conductive rubber.

The phase change heat storage layer 6 is disposed on a bottom surface inside the frame, a side surface of the phase change heat storage layer 6 is connected to an inner sidewall of the frame 1 and another side surface is connected to the second heat conductive layer 5. One end of the energy storage device 7 is electrically connected to the thermoelectric device group 2, and another end is electrically connected to a driver circuit.

The LED lamps 42 transmit heat to the thermoelectric device group 2 more efficiently through the first heat conductive layer 3, and the thermoelectric device group 2 transmits heat from the center of the thermoelectric arms 201 to both ends. Herein, heat is concentrated at the frames 1 on both sides of the backlight module, so as to accomplish heat dissipation of the backlight module. The phase change heat storage layers 6 are disposed on both sides of the frame 1, and the heat concentrated at the frame 1 on both sides of the backlight module is recycled. Specifically, the thermoelectric device group 2 transmits heat to the phase change heat storage layer 6 more efficiently through the second heat conductive layer 5. After the material of the phase change heat storage layer 6 is heated, solid-solid phase change or solid-liquid phase change will occur to store the heat, and at the same time the heat of the hot end of the thermoelectric device group 2 is carried away, so that the thermoelectric device group 2 continuously transmits the heat of the LED lamps 42 to the phase change thermal storage layer 6. When the display device is turned off, the LED lamps 42 are extinguished, and the solid-solid phase change or liquid-solid phase change occurs in the phase change heat storage layer 6, thereby releasing heat. At this moment, temperature difference is generated between two ends of the thermoelectric device group 2. A current is generated by the thermoelectric device 20 due to Seebeck effect, and electric energy output by the thermoelectric device group 20 will be stored in the energy storage device 7. The energy storage device 7 is connected to a TFT driver circuit, which can be used for driving a circuit when the display device works. Compared to the prior art, the thermoelectric devices with excellent active heat dissipation performance and a function of converting heat to electric energy are adopted by the backlight module provided in this embodiment. By using together with the phase change heat storage layer, precise temperature control and heat recycle of the LED light source in the backlight module are accomplished. The energy recycling is accomplished, energy consumption is reduced, and energy utilization rate is effectively improved.

Figure 14:
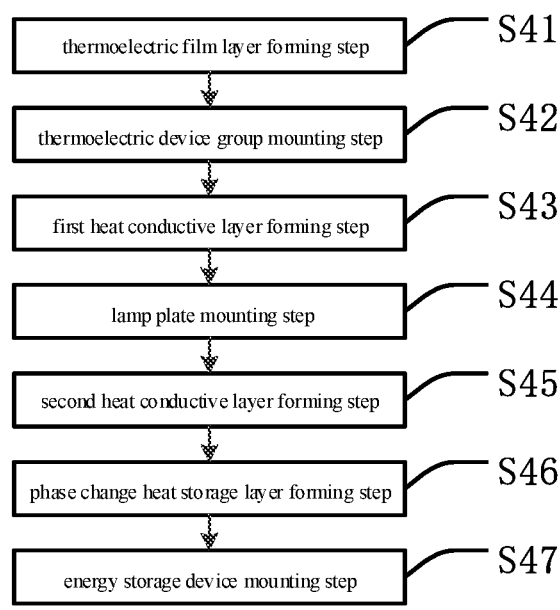
FIG. 14 is a flow chart of a manufacturing method of the backlight module according to the fourth embodiment.

As shown in FIG. 14, a manufacturing method of a backlight module is provided by this embodiment, comprising step41 to step47:

S41: a thermoelectric film layer forming step of forming a thermoelectric film layer on a flexible substrate with thermoelectric material by means of vacuum evaporation, magnetron sputtering, or screen printing, wherein the thermoelectric film layer is encapsulated and assembled to form the thermoelectric device group;

S42: as shown in FIG. 12, a thermoelectric device group mounting step of mounting two groups of thermoelectric devices 20 to a bottom surface inside a frame 1 to form a thermoelectric device group 2;

S43: a first heat conductive layer forming step of coating a thermoelectric conductive material on an upper surface of the thermoelectric device group to form a first heat conductive layer; wherein the heat conductive material is at least one of heat conductive silicone grease, alumina heat conductive rubber, or boron nitride heat conductive rubber, and the material is used for heat conducting and has high heat dissipation efficiency.

S44: as shown in FIG. 12, a lamp plate mounting step of mounting a lamp plate 4 above the thermoelectric device group 2, wherein a lower surface of the lamp plate 4 is connected to the first heat conductive layer 3;

S45: as shown in FIG. 12, a second heat conductive layer forming step of coating a thermoelectric conductive material on the bottom surface inside the frame 1 to form a second heat conductive layer 5; wherein the heat conductive material is at least one of heat conductive silicone grease, alumina heat conductive rubber, or boron nitride heat conductive rubber, and the material is used for heat conducting and has high heat dissipation efficiency.

S46: as shown in FIG. 12, a phase change heat storage layer forming step of forming a phase change heat storage layer 6 on the bottom surface inside the frame 1, wherein a side surface of the phase change heat storage layer 6 is connected to an inner sidewall of the frame 1, and another side surface is connected to the second heat conductive layer 5; and a material of the phase change heat storage layer 6 comprises at least one of crystalline hydrate salt, molten salt, metal or alloy, paraffin, or fatty acid. A height of the second heat conductive layer 5 is less than or equal to a height of the phase change heat storage layer 6. Considering the low efficiency of heat storage induced by the thin thickness of the thermoelectric film layer 22, a thickness of the phase change heat storage layer 6 is increased to improve the heat storage.

S47: as shown in FIG. 13, an energy storage device mounting step of mounting an energy storage device 7 in the frame 1, wherein one end of the energy storage device 7 is electrically connected to the thermoelectric device group 2 and another end is electrically connected to a driver circuit. On one hand, the energy storage device 7 can accomplish the heat recycle of the thermoelectric device group 2. On the other hand, it can provide a current for the driver circuit.

Compared to the prior art, the thermoelectric devices with excellent active heat dissipation performance and a function of converting heat to electric energy are adopted by the backlight module provided in this embodiment. By using together with the phase change heat storage layer, precise temperature control and heat recycle of the LED light source in the backlight module are accomplished. The energy recycling is accomplished, energy consumption is reduced, and energy utilization rate is effectively improved.

Advantageous effects of the disclosure are to provide a backlight module and a manufacturing method of the same. By disposing a first heat conductive layer at a joint of the thermoelectric device group and the LED lamp plate, heat dissipation efficiency is further increased, and a heat dissipation effect is improved. Furthermore, the second heat conductive layer and the phase change heat storage layer are disposed between the frame and the thermoelectric device group inside the frame in this disclosure. Heat of the thermoelectric device group is transmitted to the phase change heat storage layer, so that the recycle of the heat from the lamp plate is fulfilled.

The above is only the preferred embodiment of the disclosure. It should be noted that for those skilled in the art, several improvements and embellishments can be made without departing from the principle of the disclosure, which should also be regarded as the protection scope of the invention.

What is claimed is:

1. A backlight module, comprising:
    a frame;
    a thermoelectric device group disposed on a bottom surface inside the frame;
    a first heat conductive layer disposed on a surface at a side of the thermoelectric device group away from the frame; a lamp plate disposed on a surface at a side of the first heat conductive layer away from the frame;
    a phase change heat storage layer disposed on the bottom surface inside the frame, wherein a side surface is connected to an inner sidewall of the frame; and
    an energy storage device of which one end is electrically connected to the thermoelectric device group and another end is electrically connected to a driver circuit.

2. A backlight module, comprising:
    a frame;
    a thermoelectric device group disposed on a bottom surface inside the frame;
    a first heat conductive layer disposed on a surface at a side of the thermoelectric device group away from the frame; a lamp plate disposed on a surface at a side of the first heat conductive layer away from the frame;
    a second heat conductive layer disposed on the bottom surface inside the frame and connected to an edge at a side of the thermoelectric device group.

3. The backlight module of claim 2, wherein further comprises:
    a phase change heat storage layer disposed on the bottom surface inside the frame, wherein a side surface is connected to an inner sidewall of the frame and another side surface is connected to the second heat conductive layer; and
    an energy storage device of which one end is electrically connected to the thermoelectric device group and another end is electrically connected to a driver circuit.

4. The backlight module of claim 3, wherein
    a height of the second heat conductive layer is less than or equal to a height of the phase change heat storage layer.

5. The backlight module of claim 3, wherein
    a material of the phase change heat storage layer comprises at least one of crystalline hydrate salt, molten salt, metal or alloy, paraffin, or fatty acid; and/or
    the first heat conductive layer is at least one of heat conductive silicone grease, alumina heat conductive rubber, or boron nitride conductive rubber; and/or
    the second heat conductive layer is at least one of heat conductive silicone grease, alumina heat conductive rubber, or boron nitride heat conductive rubber.

6. A manufacturing method of a backlight module, comprising steps of:
    a thermoelectric device group mounting step of mounting two groups of thermoelectric devices to a bottom surface inside a frame to form a thermoelectric device group;
    a first heat conductive layer forming step of coating a thermoelectric conductive material on an upper surface of the thermoelectric device group to form a first heat conductive layer;
    a lamp plate mounting step of mounting a lamp plate above the thermoelectric device group, wherein a lower surface of the lamp plate is connected to the first heat conductive layer;
    a phase change heat storage layer forming step of forming a phase change heat storage layer on the bottom surface inside the frame, wherein a side surface of the phase change heat storage layer is connected to an inner sidewall of the frame; and
    an energy storage device mounting step of mounting an energy storage device in the frame, wherein one end of the energy storage device is electrically connected to the thermoelectric device group and another end is electrically connected to a driver circuit.

7. The manufacturing method of the backlight module of claim 6, wherein further comprises a below step following the lamp plate mounting step of:
    a second heat conductive layer forming step of coating the thermoelectric conductive material on the bottom surface inside the frame to form a second heat conductive layer.

8. The manufacturing method of the backlight module of claim 7, wherein further comprises below steps following the second heat conductive layer forming step of:
    a phase change heat storage layer forming step of forming a phase change heat storage layer on the bottom surface inside the frame, wherein a side surface of the phase change heat storage layer is connected to an inner sidewall of the frame, and another side surface is connected to the second heat conductive layer; and
    an energy storage device mounting step of mounting an energy storage device in the frame, wherein one end of the energy storage device is electrically connected to the thermoelectric device group and another end is electrically connected to a driver circuit.

* * * * *